United States Patent
Nakahama et al.

(10) Patent No.: US 6,586,055 B1
(45) Date of Patent: Jul. 1, 2003

(54) METHOD FOR DEPOSITING FUNCTIONALLY GRADIENT THIN FILM

(75) Inventors: Yasuji Nakahama, Nara (JP); Tatsushi Yamamoto, Nara (JP); Yuzo Mori, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/162,334

(22) Filed: Jun. 4, 2002

(30) Foreign Application Priority Data

| Jun. 4, 2001 | (JP) | 2001-168886 |
| Dec. 13, 2001 | (JP) | 2001-380698 |

(51) Int. Cl.[7] ............................................. H05H 1/24
(52) U.S. Cl. ............... 427/569; 427/255.23; 427/255.5; 427/255.7; 427/402; 427/428
(58) Field of Search ............................ 427/569, 255.23, 427/255.5, 255.7, 402, 428

(56) References Cited

FOREIGN PATENT DOCUMENTS

| JP | 06-333853 | 12/1994 |
| JP | 07-169697 | 7/1995 |
| JP | 09-104985 | 4/1997 |
| JP | 2000-144434 | 5/2000 |
| JP | 2000-192246 | 7/2000 |
| JP | 2000-204475 | 7/2000 |

*Primary Examiner*—Bernard Pianalto
(74) *Attorney, Agent, or Firm*—Edwards & Angell, LLP; David G. Conlin, Esq.; Richard J. Roos, Esq.

(57) ABSTRACT

A method for depositing a functionally gradient thin film of the present invention includes the steps of: introducing two or more types of material gases into a process chamber which includes a cylindrical rotary electrode provided so as to be opposed to a substrate on which a thin film is deposited, the cylindrical rotary electrode being rotated by applying a high-frequency power thereto; and sliding the substrate into the process chamber while maintaining the rotation of the cylindrical rotary electrode so as to create plasma between the cylindrical rotary electrode and the substrate for depositing the thin film.

9 Claims, 11 Drawing Sheets

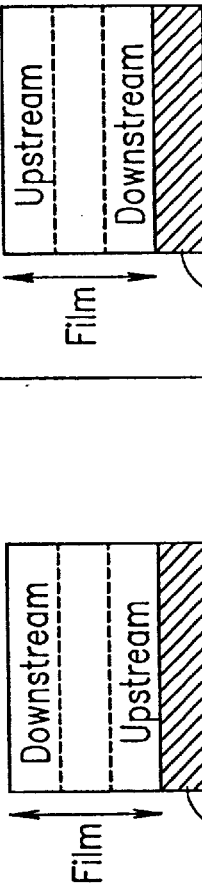

METHOD FOR DEPOSITING FUNCTIONALLY GRADIENT THIN FILM

BACKGROUND OF THE INVENTION

1. Field of the Invention

The present invention relates to a method for depositing a functionally gradient thin film, and more specifically to a method for depositing a compound thin film having a gradient function on a surface of a substrate using a plasma CVD method.

2. Description of the Related Art

FIG. 1 is a cross-sectional view of a typical plasma CVD device used in conjunction with a plasma CVD method so as to deposit a thin film on a surface of a substrate.

This plasma CVD device shown in FIG. 1 includes a process chamber 1 in which an internal space is provided so as to serve as a reaction field for depositing a thin film when the internal space is filled with a gas used as a material for the thin film. A pair of first and second parallel-plate electrodes 2 and 3 are provided in the process chamber 1 so as to be respectively positioned in the upper and lower parts of the process chamber 1 and opposed to each other in a parallel manner.

The first parallel-plate electrode 2 provided in the upper part of the process chamber 1 is connected to a high-frequency power source 6 provided outside the process chamber 1. The second parallel-plate electrode 3 provided in the lower part of the process chamber 1 is grounded. Further, the second parallel-plate electrode 3 is used as a mounting board on which a substrate 5 used for depositing a thin film is mounted. The second parallel-plate electrode 3 includes a heater 4 for heating the substrate 5 mounted on the second parallel-plate electrode 3.

A gas introduction line 7 is provided at one side of the process chamber 1 so as to introduce a material gas for depositing a thin film into the process chamber 1. The gas introduction line 7 is connected to a gas cylinder (not shown) or the like which contains the material gas. A gas exhaust line 8 is provided at the other side of the process chamber 1 so as to exhaust the gas from the process chamber 1. The gas exhaust line 8 is connected to a pump (not shown) for pumping the gas from the process chamber 1.

In the case where this plasma CVD device is used for depositing a thin film on a surface of the substrate 5, after the substrate 5 is mounted on the second parallel-plate electrode 3 in the process chamber 1, the gas introduction and exhaust lines 7 and 8 are adjusted so as to control introduction and exhaustion of the material gas, whereby the process chamber 1 is maintained so as to be filled with a prescribed amount of material gas. A high-frequency voltage is applied by the high-frequency power source 6 to the first parallel-plate electrode 2 in the process chamber 1 filled with the prescribed amount of material gas so as to create an electric field between the first and second parallel-plate electrodes 2 and 3. The electric field accelerates decomposition and excitation of the material gas between the first and second parallel-plate electrodes 2 and 3 such that the material gas is in a plasma state between the first and second parallel-plate electrodes 2 and 3, thereby resulting in a plasma space 9 indicated by a dotted line shown in FIG. 1. The plasma created in the plasma space 9 causes a desired thin film to be deposited on the surface of the substrate 5.

In such a thin film deposition method using the plasma CVD device including the pair of first and second parallel-plate electrodes 2 and 3, the material gas is required to be uniformly provided in the plasma space 9 so as to deposit a homogeneous thin film on the substrate 5. However, it is not easy to satisfy this condition when the substrate 5 on which the thin film is deposited has a large surface area. As the pressure of the material gas in the process chamber 1 is increased, the material gas provided in the plasma space 9 becomes notably nonuniform. Accordingly, when depositing the thin film on the substrate 5 having a large surface area, in general, the pressure in the process chamber 1 is reduced. However, by reducing the pressure in the process chamber 1 so as to deposit the thin film on the substrate 5, the deposition rate of the thin film is also reduced (i.e., deposition time is increased).

In consideration of this, it has been suggested to employ a method for depositing a functionally gradient thin film having a concentration gradient of an elemental composition along a thickness direction of the thin film using the plasma CVD device including the pair of first and second parallel-plate electrodes 2 and 3.

For example, Japanese Laid-Open Patent Publication No. 2000-192246 discloses a method for depositing the functionally gradient thin film by providing two or more types of different reaction gasses in a plasma space while sequentially varying their mixing ratio. Further, Japanese Laid-Open Patent Publication No. 7-169697 discloses a method for depositing the functionally gradient thin film having a concentration gradient along a thickness direction of the thin film by varying a flow rate of the carrier gas, Japanese Laid-Open Patent Publication No. 2000-144434 discloses a method for depositing the functionally gradient thin film having a concentration gradient along a thickness direction of the thin film by sequentially varying a value of a voltage or a frequency of the high-frequency power applied to an electrode by a high-frequency power source during a thin film deposition process, and Japanese Laid-Open Patent Publication No. 2000-204475 discloses a method for depositing the functionally gradient thin film having a concentration gradient along a thickness direction of the thin film by sequentially varying a temperature of the substrate.

However, in such a method which controls parameters for the thin film deposition, it is not easy to accurately control the parameters. Further in the film deposition process, quality of the portions of the film varies according to variations of the parameters and there is a time lag between a variation of the parameters and a variation of the quality, and therefore differences in quality among the portions of the film are caused.

SUMMARY OF THE INVENTION

According to another aspect of the present invention, there is provided a method for depositing a functionally gradient thin film comprising the steps of: providing a substrate on which a thin film is deposited in a process chamber which includes a cylindrical rotary electrode opposed to a substrate, the cylindrical rotary electrode being rotated by applying high-frequency power thereto; introducing two or more types of material gases into the process chamber; performing a first film deposition by rotating the cylindrical rotary electrode so as to form plasma between the cylindrical rotary electrode and the substrate for depositing the first thin film while sliding the substrate into the process chamber along a first sliding direction which is identical or opposite to a rotation direction of the cylindrical rotary electrode; and performing a second film deposition after the first film deposition by sliding the substrate along a second sliding direction opposite to the first sliding direction.

In one embodiment of this invention, the substrate is slid along a rotation direction of the cylindrical rotary electrode through a plasma space in which the plasma is created between the cylindrical rotary electrode and the substrate.

In one embodiment of this invention, the substrate is slid along a direction opposite to the rotation direction of the cylindrical rotary electrode through the plasma space in which the plasma is created between the cylindrical rotary electrode and the substrate.

In one embodiment of this invention, a thin film is deposited on the substrate under fixed conditions from a beginning to an end of the film deposition process.

In one embodiment of this invention, the fixed conditions include concentrations related to concentrations of the material gases in the process chamber, the high-frequency power applied to the cylindrical rotary electrode so as to create the plasma, a size of a gap between the cylindrical rotary electrode and the substrate, a number of rotations per amount of time of the cylindrical rotary electrode, a temperature of the substrate, and a sliding speed of the substrate.

According to another aspect of the present invention, there is provided a method for depositing a functionally gradient thin film comprising the steps of: providing a substrate on which a thin film is deposited in a process chamber which includes a cylindrical rotary electrode opposed to the cylindrical rotary electrode, the cylindrical rotary electrode being rotated by applying high-frequency power thereto; introducing two or more types of material gases into the process chamber; performing a first film deposition by rotating the cylindrical rotary electrode so as to form plasma between the cylindrical rotary electrode and the substrate for depositing the first thin film while sliding the substrate into the process chamber along a first sliding direction which is identical or opposite to a rotation direction of the cylindrical rotary electrode; and performing a second film deposition after the first film deposition by sliding the substrate along a second sliding direction opposite to the first sliding direction.

According to still another aspect of the present invention, there is provided a method for depositing a functionally gradient thin film comprising the steps of: providing a plurality of process chambers connected to each other, each of the plurality of process chambers including a cylindrical rotary electrode being rotated by applying high-frequency power thereto; introducing two or more types of material gases having different dissociation energies into each of the plurality of process chambers; and depositing thin films by rotating the cylindrical rotary electrodes included in the plurality of process chambers along different directions while sliding a substrate on which the thin films are deposited through the plurality of process chambers along a prescribed direction so as to create plasma between the cylindrical rotary electrode and the substrate in each of the plurality of process chamber for depositing the films.

According to still another aspect of the present invention, there is provided a method for depositing a functionally gradient thin film comprising the steps of: providing a plurality of process chambers connected to each other, each of the plurality of process chambers including a cylindrical rotary electrode being rotated by applying high-frequency power thereto; introducing two or more types of material gases having substantially equivalent dissociation energies into at least one of the plurality of process chambers and introducing two or more types of material gases having different dissociation energies into at least one of the other process chambers; and depositing thin films by rotating the cylindrical rotary electrodes included in the plurality of process chambers along their respective prescribed directions while sliding a substrate on which the thin films are deposited through the plurality of process chambers along a prescribed direction so as to create plasma between the cylindrical rotary electrode and the substrate in each of the plurality of process chamber for depositing the films.

According to still another aspect of the present invention, there is provided a method for depositing a functionally gradient thin film comprising the steps of: providing a plurality of process chambers connected to each other, each of the plurality of process chambers including a cylindrical rotary electrode being rotated by applying high-frequency power thereto; introducing two or more types of material gases having substantially equivalent dissociation energies into at least one of the plurality of process chambers and introducing two or more types of material gases having different dissociation energies into at least one of the other process chambers; performing a first film deposition by rotating the cylindrical rotary electrodes included in the plurality of process chambers along their respective rotation directions while sliding a substrate through the plurality of process chambers along a first sliding direction which is a prescribed direction; and performing a second film deposition after the first film deposition by sliding the substrate along a second sliding direction opposite to the first sliding direction.

Thus, the invention described herein makes possible the advantages of providing: (1) a method for easily depositing a functionally gradient thin film having a concentration gradient along a thickness direction of the thin film; and (2) a method for depositing a functionally gradient thin film having an elemental composition in which different types of elements are complexly distributed along a thickness direction of the thin film and another functionally gradient thin film having an elemental composition in which a part of different types of elements is homogeneously distributed such that a composition ratio between the different types of elements is invariable.

These and other advantages of the present invention will become apparent to those skilled in the art upon reading and understanding the following detailed description with reference to the accompanying figures.

BRIEF DESCRIPTION OF THE DRAWINGS

FIG. 6 illustrates an elemental composition of a thin film deposited on a substrate under a condition where two or more types of gases having substantially same dissociation energies are introduced as material gases into a process chamber of a plasma CVD device having a cylindrical rotary electrode in each of the following cases of: sliding the substrate along direction A shown in FIG. 3; and sliding the substrate along direction B shown in FIG. 3.

DESCRIPTION OF THE PREFERRED EMBODIMENTS

Hereinafter, embodiments of the present invention will be described with reference to the drawings.

Embodiment 1

Figure 1:
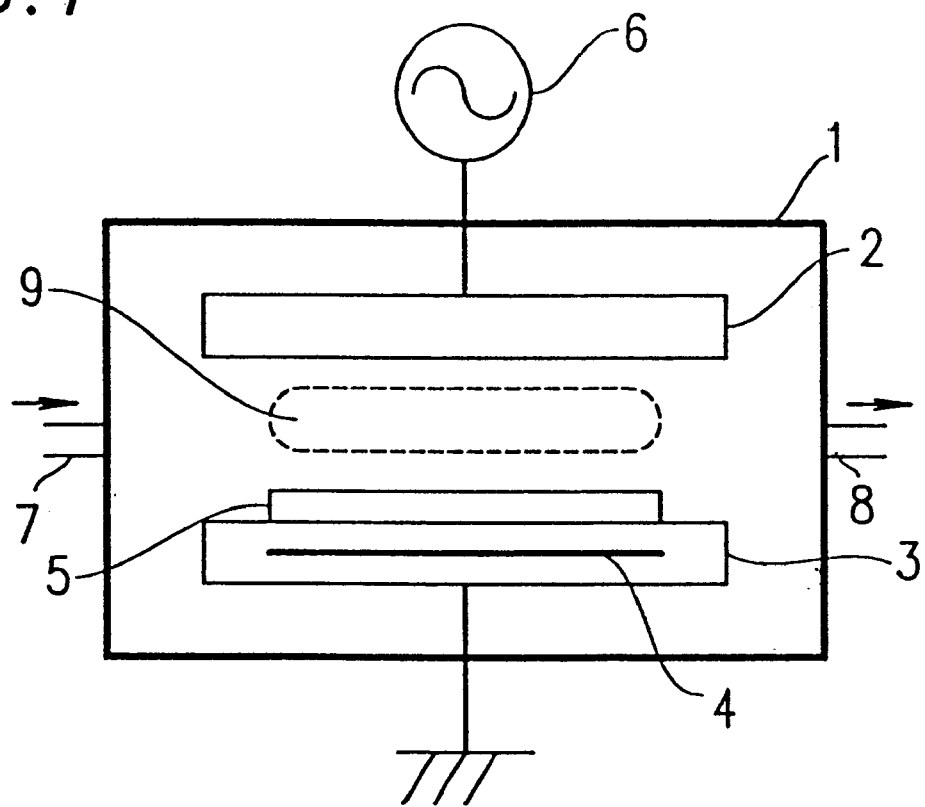
FIG. 1 is a cross-sectional view of a typical plasma CVD device having a parallel-plate electrode and used in conjunction with a plasma CVD method so as to deposit a thin film on a surface of a substrate.

In a method for depositing a functionally gradient thin film according to Embodiment 1 of the present invention, a plasma CVD device including a cylindrical rotary electrode is used. Such a plasma CVD device including a cylindrical rotary electrode is disclosed in Japanese Laid-Open Patent Publication No. 9-104985, etc., as a plasma CVD device which solves the problems of the conventional plasma CVD device including the pair of first and second parallel-plate electrodes 2 and 3 shown in FIG. 1.

Figure 2A:
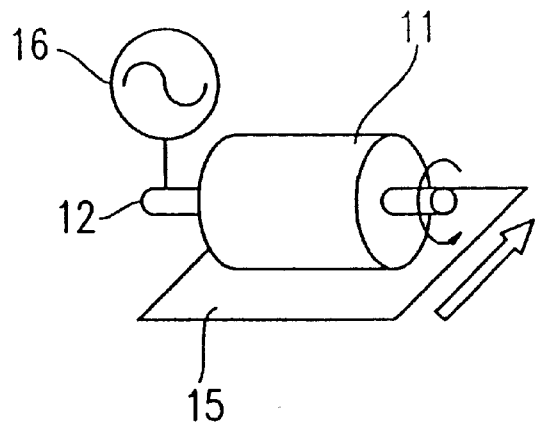
FIG. 2A is a schematic perspective view illustrating a primary structure of a plasma CVD device including a cylindrical rotary electrode according to Embodiment 1 of the present invention.
Figure 2B:
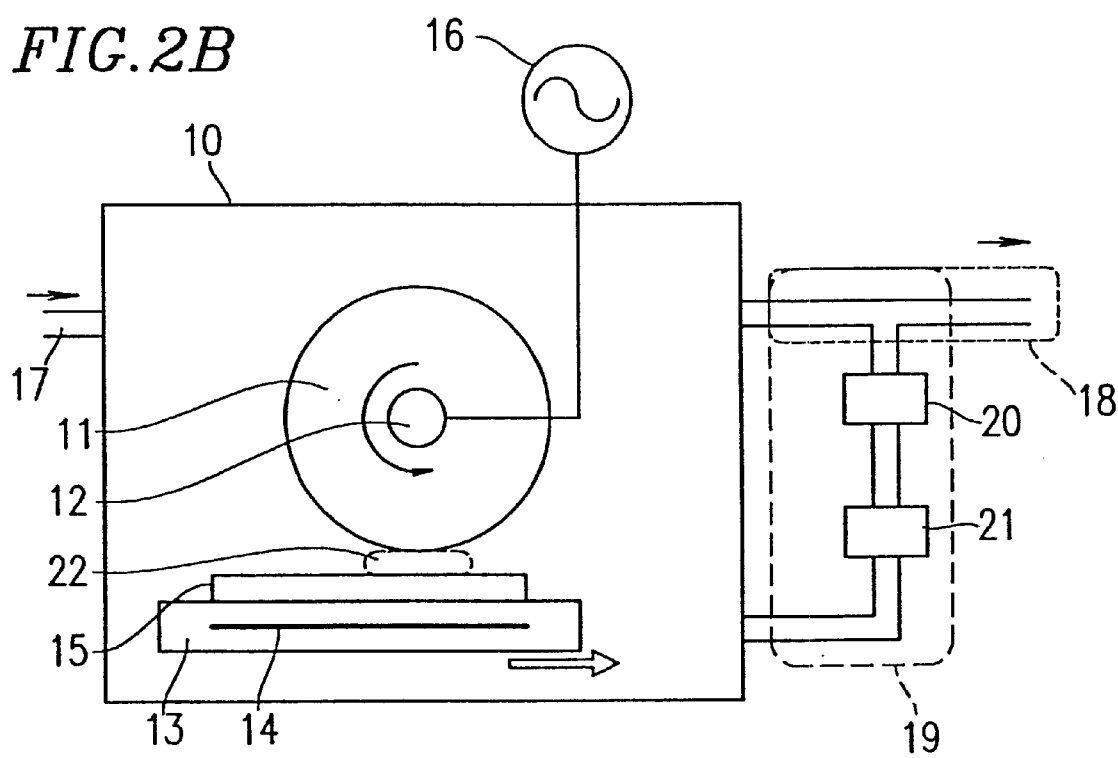
FIG. 2B is a schematic view illustrating an overall structure of the plasma CVD device of FIG. 2A.

FIG. 2A is a schematic perspective view illustrating a primary structure of the plasma CVD device including the cylindrical rotary electrode according to Embodiment 1 of the present invention. FIG. 2B is a schematic view illustrating an overall structure of the plasma CVD device of FIG. 2A.

Referring to FIGS. 2A and 2B, the plasma CVD device according to Embodiment 1 of the present invention includes a substrate stage 13 provided in the lower part of a process chamber 10 so as to be horizontal with respect to a bottom surface of the process chamber 10. A substrate 15 is mounted on the substrate stage 13. The plasma CVD device according to Embodiment 1 of the present invention further includes a cylindrical rotary electrode 11 above the substrate stage 13 such that a rotation shaft 12 is parallel to the substrate stage 13.

The rotation shaft 12 of the cylindrical rotary electrode 11 is connected to a high-frequency power source 16 provided outside the process chamber 10 so as not to prevent the rotation of the rotation shaft 12 through obstruction with the cylindrical rotary electrode 11, for example. The substrate stage 13 is grounded (not shown). Further, the substrate stage 13 includes a heater 14 for heating the substrate 15 mounted on the substrate stage 13.

The substrate stage 13 is configured to be slidable along a horizontal direction and movable along a vertical direction. By moving the substrate stage 13 along the vertical direction, a distance between the substrate 15 and the cylindrical rotary electrode 11 is suitably adjusted. Further, the substrate stage 13 is provided with a vacuum chuck for adsorbing and holding the substrate 15 so as not to allow the substrate 15 to be displaced from a mount position thereof by the motion of the cylindrical rotary electrode 11 or the substrate stage 13.

A gas introduction line 17 is provided at one side of the process chamber 10 so as to introduce a material gas for depositing a thin film into the process chamber 10. The gas introduction line 17 is connected to a gas cylinder (not shown) or the like which contains the material gas. A gas exhaust line 18 is provided at the other side of the process chamber 10 so as to exhaust the gas from the process chamber 10. The gas exhaust line 18 is connected to a pump (not shown) for pumping the gas from the process vessel 10. Further, a circulation line 19 is provided to the process chamber 10 so as to remove particles created in the process chamber 10. The circulation line 19 diverges from the gas exhaust line 18 so as to be in communication with the process chamber 10. The circulation line 19 is provided with a particle removal filter 20 and a circulation pump 21 in this order from the side of the gas exhaustion line 18.

In the circulation gas line 19, the circulation pump 21 is driven so as to pump a gas from the process chamber 10, thereby circulating particles created in the plasma space of the process chamber 10 together with the gas so as to trap the particles in the particle removal filter 20. This prevents the thin film deposited on the substrate 15 from including the particles, which may deteriorate the desired characteristics of the film.

In the case of depositing a thin film on the surface of the substrate 15 using the plasma CVD device which uses the cylindrical rotary electrode 11 according to Embodiment 1 of the present invention, firstly gas is fully exhausted from the process chamber 10 via the gas exhaust line 18, and then the circulation pump 21 provided on the circulation line 19 is activated while introducing a desired material gas into the process chamber 10 via the gas introduction line 17. Next, after setting a variety of parameters for the thin film deposition, such as a rotation speed of the cylindrical rotary electrode 11, a gap between the cylindrical rotary electrode 11 and the substrate 15 mounted on the substrate stage 13, horizontal sliding speed and direction of the substrate stage 13, a temperature of the heater 14 included in the substrate stage 13, etc., high-frequency power is applied to the cylindrical rotary electrode 11 by the high-frequency power source 16. When this high-frequency power is applied to the cylindrical rotary electrode 11, plasma is created in the gap between the cylindrical rotary electrode 11 and the substrate stage 13, thereby forming a plasma space 22 indicated by a dotted line shown in FIG. 2B. In such a state, by sliding the substrate stage 13 along a rotation direction of the cylindrical rotary electrode 11 while maintaining the substrate stage 13 horizontally with respect to the cylindrical rotary electrode 11, a desired thin film is deposited on the substrate 15 mounted on the substrate stage 13.

In the plasma CVD device using the cylindrical rotary electrode 11 according to Embodiment 1 of the present invention, high-speed rotation of the cylindrical rotary electrode 11 causes the material gas having viscosity to be introduced into the plasma space 22, thereby uniformly providing the material gas in the plasma space 22. As a result, even when the thin film is deposited under atmospheric pressure, the thin film can be deposited in a rapid manner and the quality of the deposited thin film can be improved. Further, in the plasma CVD device according to Embodiment 1 of the present invention, the gap between the cylindrical rotary electrode 11 and the substrate 15 mounted on the substrate stage 13 can be adjusted to be small (i.e., the cylindrical rotary electrode 11 and the substrate 15 are in close proximity to each other) and therefore the efficiency of the material gas in depositing the thin film can be improved. Furthermore, the cylindrical rotary electrode 11 is cooled by the high-speed rotation thereof so that the surface of the cylindrical rotary electrode 11 is sufficiently cooled. This provides a number of advantages, for example, high electric power can be applied to the cylindrical rotary electrode 11, and the deposition rate of the thin film and homogeneity of the thin film can be significantly increased.

Figure 3:
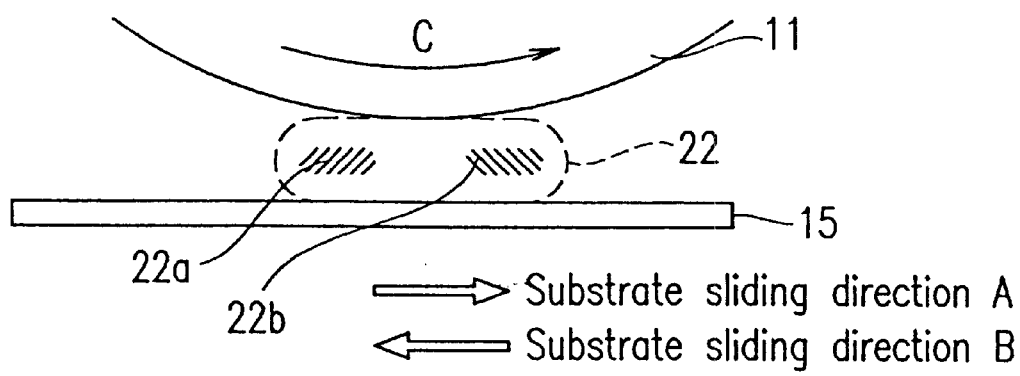
FIG. 3 is a schematic view for explaining a mechanism of depositing a thin film having a concentration gradient along a thickness direction thereof using the plasma CVD device having the cylindrical rotary electrode according to Embodiment 1 of the present invention.

FIG. 3 is a schematic view for explaining a mechanism of depositing a thin film having a concentration gradient along a thickness direction thereof using the plasma CVD device having the cylindrical rotary electrode 11 according to Embodiment 1 of the present invention.

In Embodiment 1 of the present invention, two or more types of gases having different dissociation energies are provided as material gases in the process chamber 10 of the plasma CVD device having the cylindrical rotary electrode 11. When the cylindrical rotary electrode 11 is rotated along a direction indicated by arrow C shown in FIG. 3, the rotation of the cylindrical rotary electrode 11 causes the material gases in the process chamber 10 to be introduced into the plasma space 22 created in the gap between the cylindrical rotary electrode 11 and the substrate 15 mounted on the substrate stage 13. In this case, due to a difference between the material gases with respect to quantity of the dissociation energy, a material gas having a small dissociation energy is mainly decomposed in an upstream area 22a of the plasma space 22 while a material gas having a large dissociation energy is hardly decomposed, and therefore a small amount of active species which contributes to the thin film deposition is produced from the material gas having a large dissociation energy. Accordingly, a thin film, which includes a number of elements sourced from the material gas having a small dissociation energy, is deposited on an area of the substrate 15 corresponding to the upstream area 22a of the plasma space 22.

On the other hand, in a downstream area 22b, a small amount of active species, which contributes to the thin film deposition, is produced from the material gas having a small dissociation energy since the material gas having a small dissociation energy is completely decomposed in the upstream area 22a, while a sufficient amount of active species to contribute to the thin film deposition is produced from the material gas having a large dissociation energy. Accordingly, a thin film, which includes a number of elements sourced from the material gas having a large dissociation energy, is deposited on an area of the substrate 15 corresponding to the downstream area 22b of the plasma space 22. In the case where the material gas having a large dissociation energy is completely decomposed, a thin film is hardly deposited in the downstream area 22b of the plasma space 22.

Further, in an area between the upstream area 22a and the downstream area 22b, decomposition states of the material gases sequentially vary along a direction from the upstream area 22a to the downstream area 22b, and therefore a concentration gradient is formed such that a composition ratio of the elements sourced from the material gas having a large dissociation energy to the elements sourced from the material gas having a small dissociation energy is sequentially increased along the direction from the upstream area 22a to the downstream area 22b.

Figure 4:
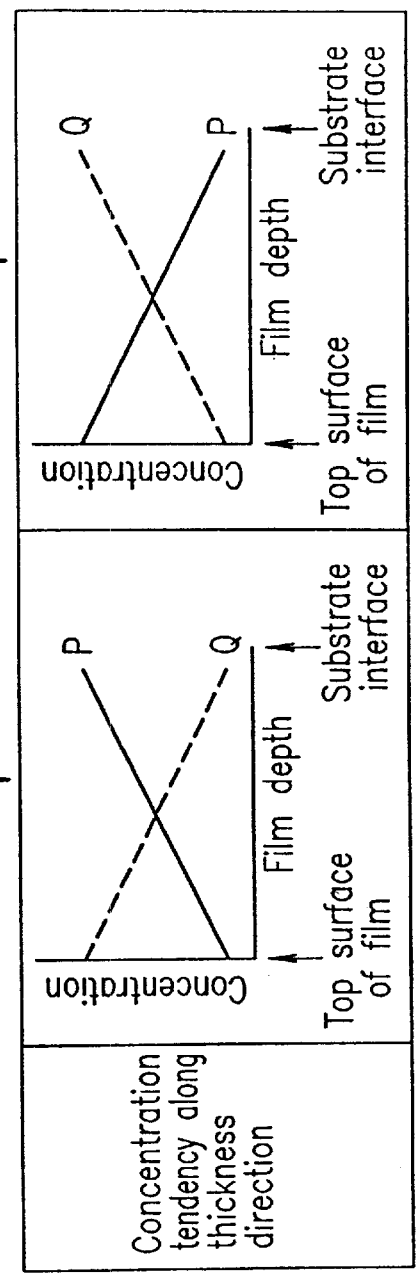
FIG. 4 illustrates an elemental composition of a thin film deposited on a substrate under a condition where a plasma space is created between the substrate and the cylindrical rotary electrode in each of the following cases of: sliding the substrate along a direction A shown in FIG. 3; and sliding the substrate along direction B shown in FIG. 3.

FIG. 4 illustrates an elemental composition of a thin film deposited on the substrate 15 under a condition where the plasma space 22 is created between the substrate 15 and the cylindrical rotary electrode 11 in each of the following cases of: sliding the substrate 15 along a direction from the upstream area 22a to the downstream area 22b of the plasma space 22 as indicated by a substrate sliding direction A shown in FIG. 3 (hereinafter, referred to as "direction A"); and sliding the substrate 15 along a direction from the downstream area 22b to the upstream area 22a of the plasma space 22 as indicated by a substrate sliding direction B shown in FIG. 3 (hereinafter, referred to as "direction B").

In the case of sliding the substrate 15 along direction A, a portion of a thin film is initially deposited by the active species existing in the upstream area 22a of the plasma space 22 and then another portion of the thin film is deposited by the active species existing in the downstream area 22b of the plasma space 22 with the substrate 15 sliding along direction A. Therefore, the lower portion of the thin film includes a number of elements sourced from the material gas mainly existing in the upstream area 22a of the plasma space 22 and having a small dissociation energy, and a ratio of the elements sourced from the material gas having a large dissociation energy to the elements sourced from the material gas having a small dissociation energy is sequentially increased along a direction toward the top surface of the thin film, thereby resulting in a functionally gradient thin film in which an elemental composition sequentially varies along a thickness direction thereof.

Alternatively, in the case of sliding the substrate 15 along direction BP a portion of a thin film is initially deposited by the active species existing in the downstream area 22b of the plasma space 22 and then another portion of the thin film is deposited by the active species existing in the upstream area 22a of the plasma space 22 with the substrate 15 sliding along direction B. Therefore, the lower portion of the thin film includes a number of elements sourced from the material gas mainly existing in the downstream area 22b of the plasma space 22 and having a large dissociation energy, and a ratio of the elements sourced from the material gas having a small dissociation energy to the elements sourced from the material gas having a large dissociation energy is sequentially increased along a direction toward the top of the thin film, thereby resulting in a functionally gradient thin film in which an elemental composition sequentially varies along a thickness direction thereof.

In this manner, the method for depositing a functionally gradient thin film according to Embodiment 1 of the present invention provides a functionally gradient thin film under fixed conditions without the need to control the parameters for the thin film deposition, such as varying concentrations of the material gases provided in the process chamber, the flow rate of the carrier gas, a value of a voltage or a frequency of the high-frequency power applied to the electrode, a temperature of the substrate and the like.

EXAMPLE 1

Hereinbelow, an example of an atmospheric plasma CVD device having the cylindrical rotary electrode according to Embodiment 1 of the present invention is described.

Example 1 is described with respect to a case where an $SiN_x$ film is deposited using material gases, which include $SiH_4$ gas, $N_2$ gas and $H_2$ gas, and He gas, which is a carrier gas, in atmospheric pressure. Dissociation energies of the $SiH_4$ and $N_2$ gases used as the material gases are shown in Table 1. Conditions for depositing the $SiN_x$ film are shown in Table 2.

TABLE 1

Dissociation Energies of Gaseous Molecules

| Gaseous Molecules | Dissociation Energies |
|---|---|
| $SiH_4$ | 4.0 eV |
| $N_2$ | 9.8 eV |

TABLE 2

Conditions for depositing the $SiN_x$ film

|  | $SiH_4$ Concentration | $N_2$ Concentration | $H_2$ Concentration | Input Power | Gap between Electrode and Substrate | Number of Electrode Rotations | Substrate Temperature | Sliding Speed | Sliding Direction |
|---|---|---|---|---|---|---|---|---|---|
| Sample A | 0.05% | 1% | 1% | 200 W | 800 μm | 3000 rpm | 300° C. | 1 mm/s | Direction A of FIG. 3 |
| Sample B | 0.05% | 1% | 1% | 200 W | 800 μm | 3000 rpm | 300° C. | 1 mm/S | Direction B of FIG. 3 |

Figure 5A:
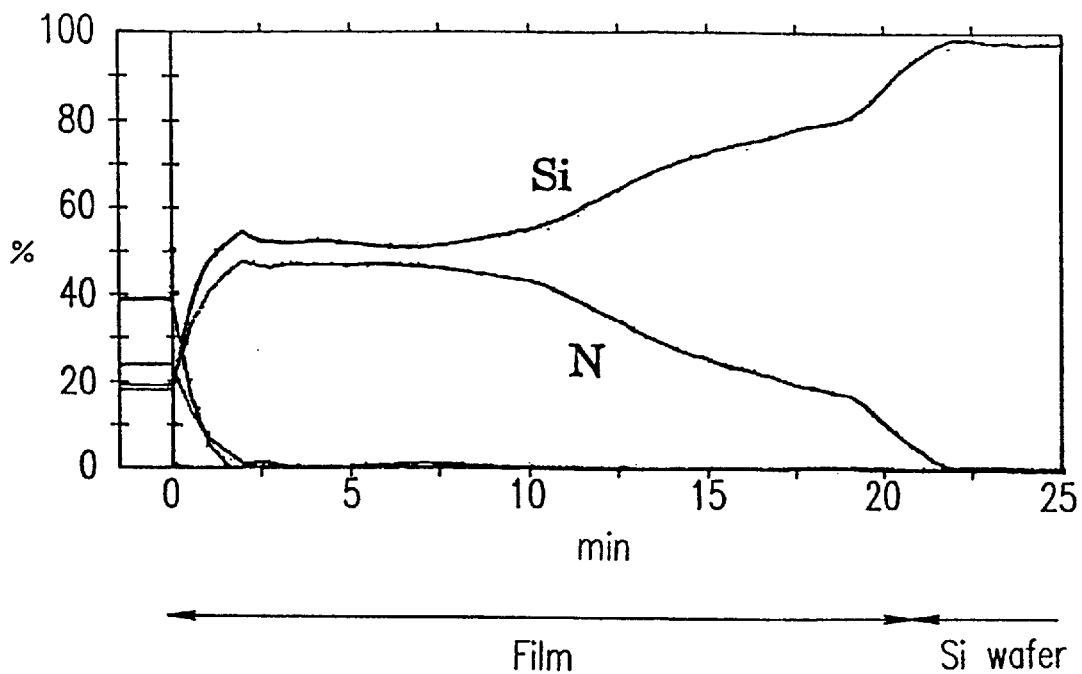
FIG. 5A shows an analysis result with respect to a thin film deposited by sliding the substrate along the direction A shown in FIG. 3.
Figure 5B:
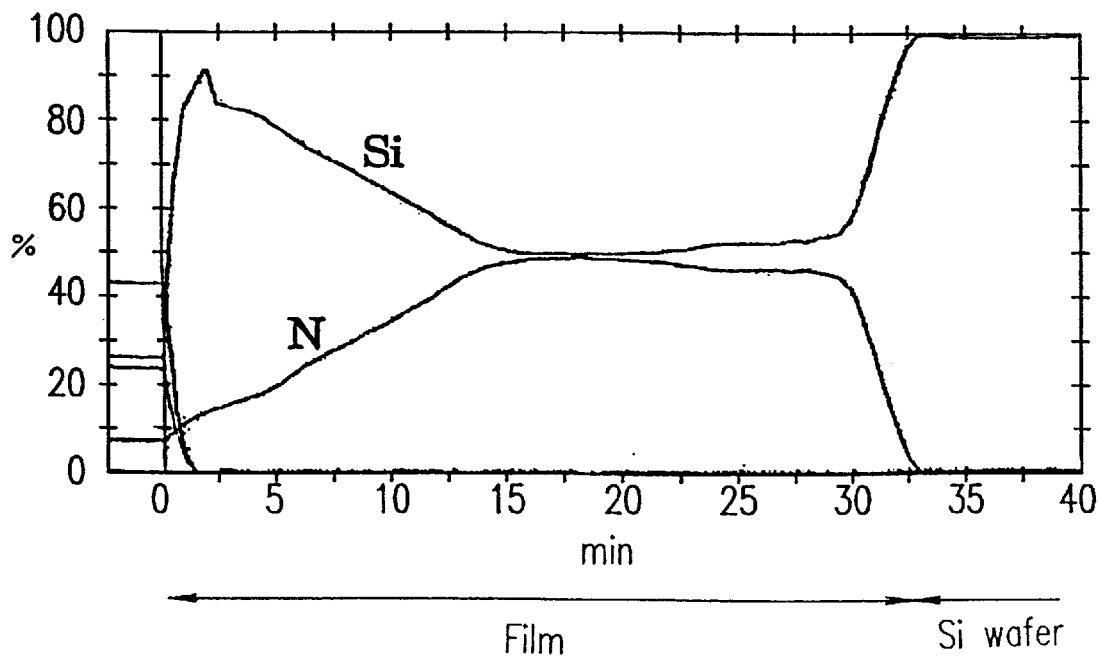
FIG. 5B shows an analysis result with respect to a thin film deposited by sliding the substrate along direction B shown in FIG. 3.

The $SiN_x$ film is deposited on a silicon wafer as a substrate using the aforementioned material gases and film deposition conditions. The obtained $SiN_x$ film is analyzed with respect to an elemental composition along a thickness direction thereof using Auger electron spectroscopy. FIGS. 5A and 5B show results of the composition analysis. Specifically, FIG. 5A shows the analysis result with respect to a sample A which is a film deposited by sliding the substrate along direction A shown in FIG. 3 and FIG. 5B shows the analysis result with respect to a sample B which is a film deposited by sliding the substrate along direction B shown in FIG. 3.

Referring to FIGS. 5A and 5B, it can be appreciated that each of the samples A and B has a concentration gradient of an elemental composition along a direction from the surface of the thin film to the interface between the thin film and the silicon substrate (Si wafer). Also, it is apparent that functionally gradient thin films having opposite concentration gradients are deposited by sliding the substrate along opposite directions.

As described above, by introducing two or more types of material gases having different dissociation energies into the plasma CVD device having the cylindrical rotary electrode, it is possible to deposit the functionally gradient thin film having a concentration gradient of the elemental composition along the thickness direction of the thin film. The method according to Example 1 simply uses fixed parameters for depositing a thin film, and therefore the functionally gradient thin film can be easily deposited.

Embodiment 2

The method for depositing a functionally gradient thin film according to Embodiment 1 is applied to Embodiment 2 so as to deposit a functionally gradient thin film having an elemental composition in which different types of elements are complicatedly distributed along a thickness direction of the thin film and another functionally gradient thin film having an elemental composition in which a part of different types of elements is homogeneously distributed such that a composition ratio between the different types of elements is invariable.

FIG. 6 illustrates an elemental composition of a thin film deposited on the substrate 15 under a condition where two or more types of gases having substantially equivalent dissociation energies are introduced as material gases into the process chamber 10 of the plasma CVD device having the cylindrical rotary electrode 11 in each of the following cases of: sliding the substrate 15 along a direction from the upstream area 22a to the downstream area 22b of the plasma space 22 as indicated by a substrate sliding direction A shown in FIG. 3; and sliding the substrate 15 along a direction from the downstream area 22b to the upstream area 22a of the plasma space 22 as indicated by a substrate sliding direction B shown in FIG. 3.

In these cases, decomposition states of the material gases do not sequentially vary along a direction from the upstream area 22a to the downstream area 22b of the plasma space 22, and therefore the decomposition states of the material gases are the same in any area of the plasma space 22. Accordingly, in the case where two or more types of material gases having substantially equivalent dissociation energies are used as the material gasses, a thin film is deposited such that a ratio between different types of elements of the thin film is invariable along the thickness direction thereof in either case of sliding the substrate 15 along direction A or direction B shown in FIG. 3.

Figure 7:
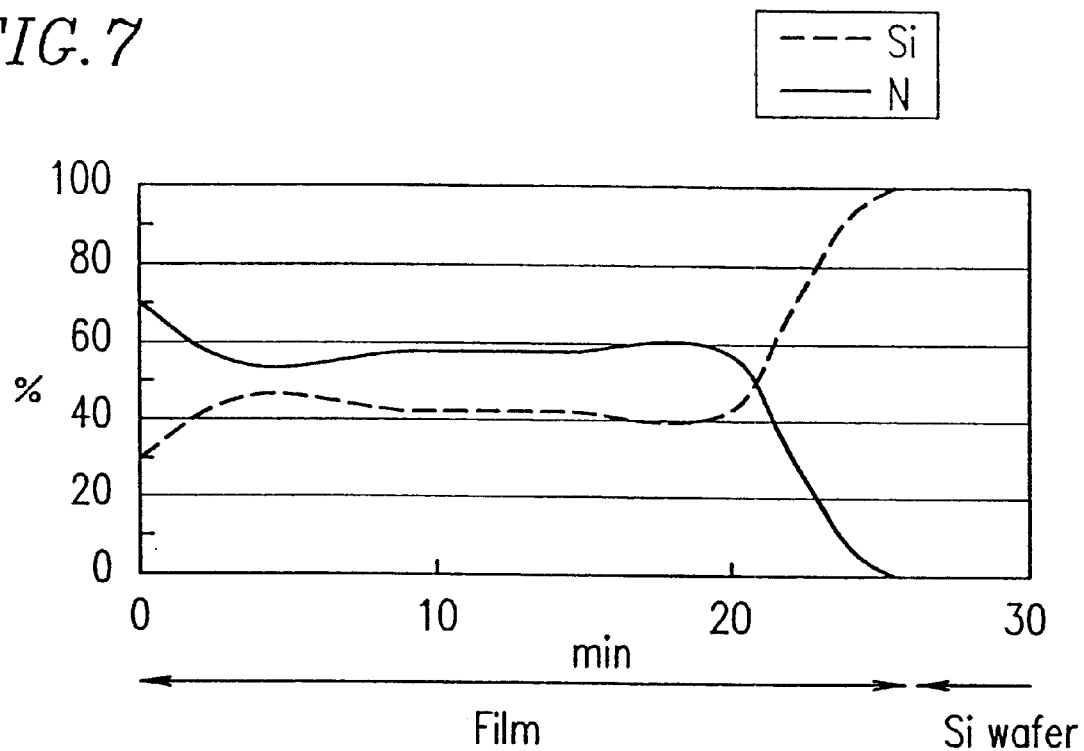
FIG. 7 is a graph showing an elemental composition along a thickness direction of a thin film actually obtained using a mixed gas in relation to FIG. 6.

Specifically, as shown in Table 3, $NH_3$ gas has a dissociation energy substantially equivalent to that of $SiH_4$ gas. When providing a mixed gas of the $NH_3$ and $SiH_4$ gases as a material gas in the process chamber 10, the thin film is deposited such that a ratio between different types of elements of the thin film is invariable along the thickness direction thereof. FIG. 7 is a graph showing the elemental composition along the thickness direction of the thin film actually obtained using the mixed gas in relation to FIG. 6. From FIG. 7, it is appreciated that the thin film is homogeneous and a ratio between different types of elements is invariable along the thickness direction of the thin film.

TABLE 3

Dissociation Energies of Gaseous Molecules

| Gaseous Molecules | Dissociation Energies |
| --- | --- |
| $SiH_4$ | 4.0 eV |
| $NH_3$ | 4.7 eV |
| $N_2$ | 9.8 eV |

Further, $N_2$ gas has a larger dissociation energy than $SiH_4$ gas, and therefore when a mixed gas of the $SiH_4$ and $N_2$ gases is provided as a material gas in the process chamber 10, an amount of decomposed $SiH_4$ gas is large on the upstream side of a rotation direction of the cylindrical rotary electrode 11 and an amount of decomposed $N_2$ gas is large on the downstream side of the rotation direction of the cylindrical rotary electrode 11. Accordingly, when sliding the substrate 15 along direction A shown in FIG. 3, a thin film is deposited so as to have a concentration gradient such that the lower portion of the thin film includes a large number of Si elements derived from the $SiH_4$ gas having a small dissociation energy and a ratio of N elements to the Si elements is increased in the elemental composition of the thin film along a direction toward the top surface of the thin film. Alternatively, when sliding the substrate 15 along direction B shown in FIG. 3, a thin film is deposited so as to have a concentration gradient such that the lower portion of the thin film includes a large number of N elements derived from the $N_2$ gas having a large dissociation energy and a ratio of the Si elements to the N elements is increased in the elemental composition of the thin film along a direction toward the top surface of the thin film.

In this manner, the method for depositing the functionally gradient thin film according to Embodiment 2 of the present invention provides a functionally gradient thin film by providing two or more types of material gases having different dissociation energies in the process chamber 10 under fixed conditions without the need to control the parameters for the thin film deposition, such as varying a concentration of the material gas provided in the process chamber 10, the flow rate of the carrier gas, a value of a voltage or a frequency of the high-frequency power applied to the electrode, a temperature of the substrate and the like. Further, by providing two or more types of material gases having substantially equivalent dissociation energies in the process chamber 10, a homogeneous thin film can be deposited so as to have a concentration gradient in which a ratio between different types of elements of the thin film is invariable along the thickness direction thereof.

Hereinafter, examples of the atmospheric plasma CVD device having the cylindrical rotary electrode according to Embodiment 2 of the present invention are described.

Each of the following examples is described with respect to a case where an $SiN_x$ film is deposited using $SiH_4$ gas, which is an Si element source, $N_2$ or $NH_3$ gases, which are N element sources, $H_2$ gas and He gas, which is a carrier gas, in atmospheric pressure while controlling a composition ratio between Si and N elements along a thickness direction of the film. It should be noted that dissociation energies of the $SiH_4$ and $NH_3$ gases used as material gases are as shown in Table 1.

EXAMPLE 2

Figure 8:
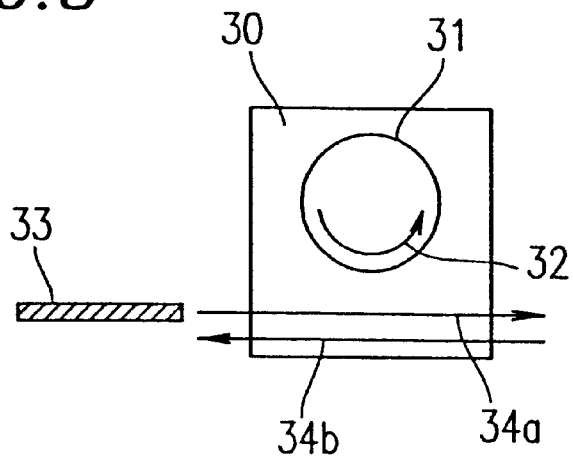
FIG. 8 is a schematic view for explaining a method for depositing a functionally gradient thin film according to Example 2 of the present invention.

FIG. 8 is a schematic view for explaining a method for depositing a functionally gradient thin film according to Example 2 of the present invention.

In the method for depositing a functionally gradient thin film according to Example 2, a single process chamber 30 is used. The process chamber 30 is filled with $SiH_4$ gas, which is an Si element source, $N_2$ gas, which is an N element source, $H_2$ gas, and a carrier gas, which is He gas, at their respective desired concentrations. In the process chamber 30 having this atmosphere, a high-frequency power is applied to a cylindrical rotary electrode 31 while rotating the cylindrical rotary electrode 31 along a direction denoted by reference numeral 32 (rotation direction 32) shown in FIG. 8.

Similar to the aforementioned examples, the application of the high-frequency power causes plasma derived from the $SiH_4$ gas having a small dissociation energy to be created on the upstream side of the rotation direction 32 in a gap between the cylindrical rotary electrode 31 and a substrate 33 and causes plasma derived from the $N_2$ gas having a large dissociation energy to be created on the downstream side of the rotation direction 32 in the gap between the cylindrical rotary electrode 31 and the substrate 33. A composition ratio of plasma derived from the $N_2$ gas is sequentially increased along a direction from the upstream side to the downstream side of the rotation direction 32.

In this state, when sliding the substrate 33 along direction 34a identical to the rotation direction 32 of the cylindrical rotary electrode 31, a thin film is deposited so as to have a concentration gradient such that the lower portion of the thin film includes a large number of Si elements having a small dissociation energy and a composition ratio of N elements to the Si elements is increased along a direction toward the top surface of the thin film.

Next, the substrate 33 is slid along direction 34b opposite to the rotation direction 32 while maintaining the atmosphere in the process chamber 30 and the rotation direction 32 of the cylindrical rotary electrode 31. As a result of this, a thin film is deposited so as to have a concentration gradient such that the lower portion of the thin film includes a large number of N elements having a large dissociation energy and a composition ratio of the Si elements to the N elements is increased along a direction toward the top surface of the thin film.

Figure 9:
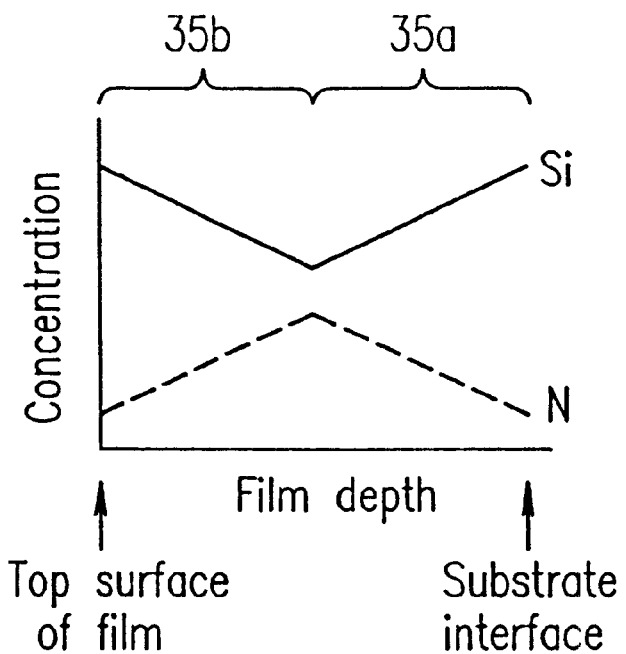
FIG. 9 shows concentration gradients along a thickness direction of thin films deposited by the method for depositing a functionally gradient thin film according to Example 2 of the present invention.

FIG. 9 shows concentration gradients along a thickness direction of the thin films deposited by the method for depositing a functionally gradient thin film according to Example 2. In FIG. 9, an area denoted by reference numeral 35a indicates a concentration gradient of a thin film deposited by sliding the substrate 33 along direction 34a shown in FIG. 8 which is identical to the rotation direction 32 of the cylindrical rotary electrode 31 and an area denoted by reference numeral 35b indicates a concentration gradient of a thin film deposited by sliding the substrate 33 along direction 34b shown in FIG. 8 which is opposite to the rotation direction 32. The method for depositing a functionally gradient thin film according to Example 2 provides a thin film having a complex concentration gradient in which a composition ratio of the N elements to the Si elements is sequentially increased along a direction toward the top surface of the thin film at the beginning and then sequentially decreased along the same direction.

EXAMPLE 3

Figure 10:
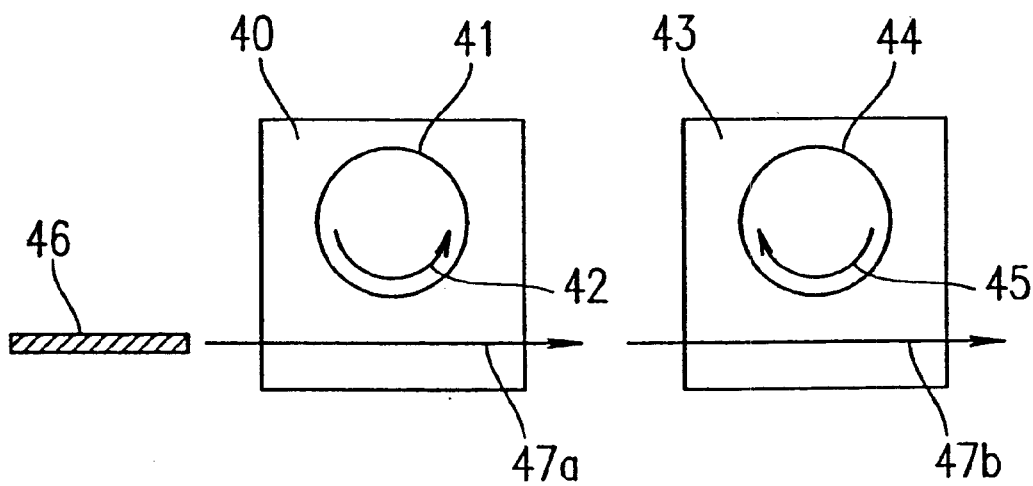
FIG. 10 is a schematic view for explaining a method for depositing a functionally gradient thin film according to Example 3 of the present invention.

FIG. 10 is a schematic view for explaining a method for depositing a functionally gradient thin film according to Example 3 of the present invention.

In the method for depositing a functionally gradient thin film according to Example 3, first and second process chambers 40 and 43 connected to each other are used. Each of the first and second process chambers 40 and 43 is filled with $SiH_4$ gas, which is an Si element source, $N_2$ gas, which is an N element source, $H_2$ gas, and He gas, which is a carrier gas, at their respective desired concentrations. Each of the first and second process chambers 40 and 43 is maintained in substantially the same atmosphere. A cylindrical rotary electrode 41 in the first process chamber 40 is rotated along a direction indicated by arrow 42 (rotation direction 42) shown in FIG. 10 and a cylindrical rotary electrode 44 in the second process chamber 43 is rotated along a direction opposite to the rotation direction 42, as indicated by arrow 45 (rotation direction 45) shown in FIG. 10. A high-frequency power is applied to each of cylindrical rotary electrodes 41 and 44 in the respective first and second process chambers 40 and 43.

Similar to the aforementioned examples, the application of the high-frequency power causes plasma derived from the $SiH_4$ gas having a small dissociation energy to be mainly created on the upstream side of each of the rotation directions 42 and 45 in a gap between the respective cylindrical rotary electrodes 41 and 44 and a substrate 46 and causes plasma derived from the $N_2$ gas having a large dissociation energy to be mainly created on the downstream side of each of the rotation direction 42 and 45 in the gap between the respective cylindrical rotary electrodes 41 and 44 and the substrate 46. A composition ratio of the plasma derived from the $N_2$ gas to the plasma derived from the $SiH_4$ gas is sequentially increased along a direction from the upstream side to the downstream side of the rotation of each of the cylindrical rotary electrodes 41 and 44.

In this state, the substrate 46 is slid into the first process chamber 40 along a direction indicated by arrow 47a (sliding direction 47a), and thereafter the substrate 46 is slid into the second process chamber 44 connected to the first process chamber 40 along a direction indicated by arrow 47b (sliding direction 47b) so as to cause a thin film deposition reaction in each of the first and second process chambers 40 and 43.

Since the sliding direction 47a of the substrate 46 is identical to the rotation direction 42 of the cylindrical rotary electrode 41, when sliding the substrate 46 through the first process chamber 40, a thin film is deposited on the substrate 46 so as to have a concentration gradient such that the lower portion of the thin film includes a large number of Si elements derived from the $SiH_4$ gas having a small dissociation energy and a ratio of the N elements to the Si elements is increased in the elemental composition of the thin film along a direction toward the top surface of the thin film.

On the other hand, since the sliding direction 47b of the substrate 46 is opposite to the rotation direction 45 of the cylindrical rotary electrode 44, when sliding the substrate 46 through the second process chamber 43, a thin film is deposited on the substrate 46 so as to have a concentration gradient such that the lower portion of the thin film includes a large number of N elements derived from the $N_2$ gas having a large dissociation energy and a ratio of the Si elements to the N elements is increased in the elemental composition of the thin film along a direction toward the top surface of the thin film.

Figure 11:
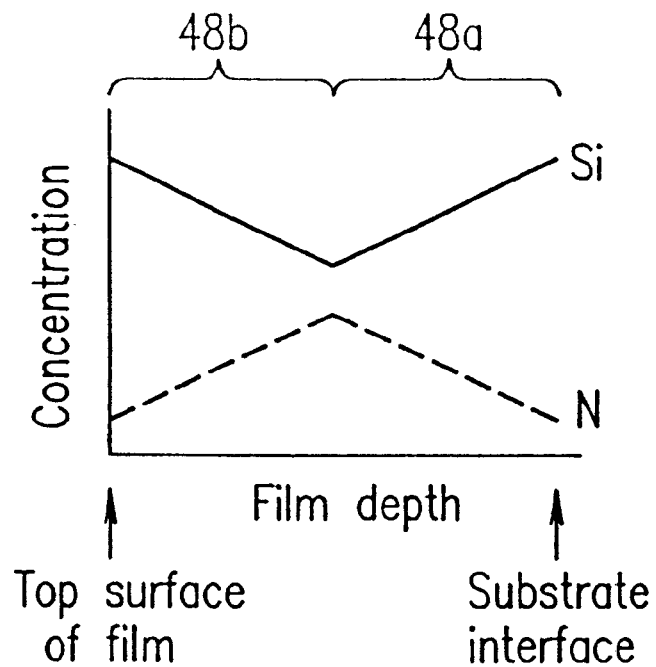
FIG. 11 shows concentration gradients along a thickness direction of thin films deposited by the method for depositing a functionally gradient thin film according to Example 3 of the present invention.

FIG. 11 shows concentration gradients along a thickness direction of the thin films deposited by the method for depositing a functionally gradient thin film according to Example 3. In FIG. 11, an area denoted by reference numeral 48a indicates a concentration gradient of a thin film deposited by sliding the substrate 46 through the first process chamber 40 and an area denoted by reference numeral 48b indicates a concentration gradient of a thin film deposited by sliding the substrate 46 through the second process chamber 43. The method for depositing a functionally gradient thin film according to Example 3 provides a thin film having a complex concentration gradient in which a composition ratio of the N elements to the Si elements is sequentially increased along a direction toward the top surface of the thin film at the beginning and then sequentially decreased along the same direction.

EXAMPLE 4

Figure 12:
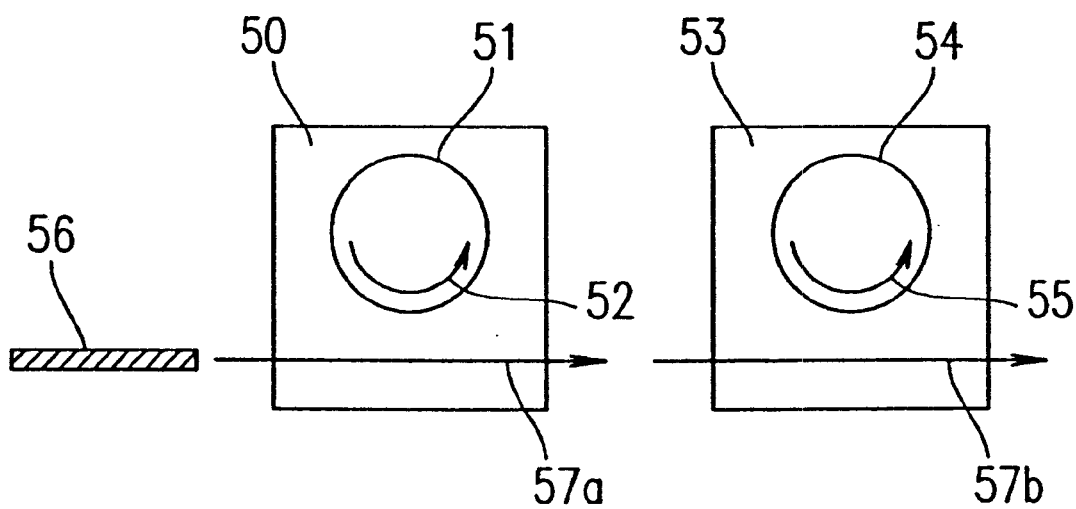
FIG. 12 is a schematic view for explaining a method for depositing a functionally gradient thin film according to Example 4 of the present invention.

FIG. 12 is a schematic view for explaining a method for depositing a functionally gradient thin film according to Example 4 of the present invention.

In the method for depositing a functionally gradient thin film according to Example 4, first and second process chambers 50 and 53 connected to each other are used. A substrate 56 on which a thin film is deposited is successively slid through the first and second process chambers 50 and 53 connected to each other.

The first process chamber 50 is located on the upstream side of a direction along which the substrate 56 is moved (hereinafter, referred to as the "substrate moving direction") and is filled with $SiH_4$ gas, which is an Si element source, $N_2$ gas, which is an N element source, $H_2$ gas, and He gas, which is a carrier gas, at their respective desired concentrations. The second process chamber 53 is located on the downstream side of the substrate moving direction and is filled with $SiH_4$ gas, which is an Si element source, $NH_3$ gas, which is an N element source, $H_2$ gas, and He gas, which is a carrier gas, at their respective desired concentrations. Each of the first and second process chambers 50 and 53 is maintained in its respective atmosphere as described above. A cylindrical rotary electrode 51 in the first process chamber 50 is rotated along a direction indicated by arrow 52 (rotation direction 52) shown in FIG. 12 which is identical to a direction (the substrate moving direction) denoted by reference numeral 57a and a cylindrical rotary electrode 54 in the second process chamber 53 is rotated along a direction indicated by arrow 55 (rotation direction 55) shown in FIG. 12 which is identical to a direction (the substrate moving direction) denoted by reference numeral 57b. A high-frequency power is applied to each of the cylindrical rotary electrodes 51 and 54 in the respective first and second process chambers 50 and 53 so as to create plasma.

Since the $SiH_4$ and $N_2$ gases introduced into a gap between the cylindrical rotary electrode 51 and the substrate 56 slid into the first process chamber 50 have different dissociation energies as shown in Table 3, when the high-frequency power is applied to the cylindrical rotary electrode 51, a plasma space created in the gap includes a large number of Si elements derived from the $SiH_4$ gas having a small dissociation energy on the upstream side of the rotation direction 52 of the cylindrical rotary electrode 51 and a composition ratio of the N elements derived from the $N_2$ gas having a large dissociation energy is sequentially increased along a direction from the upstream side to the downstream side of the rotation direction 52.

Therefore, when sliding the substrate 56 in the first process chamber 50, a thin film is deposited on the substrate 56 so as to have a concentration gradient such that the lower portion of the thin film includes a large number of Si elements derived from the SiH$_4$ gas having a small dissociation energy and a ratio of the N elements to the Si elements is increased in the elemental composition of the thin film along a direction toward the top surface of the thin film.

After the thin film deposition in the first process chamber 50 is completed, the substrate 56 is slid into the second process chamber 53.

Since the SiH$_4$ and NH$_3$ gases introduced into a gap between the cylindrical rotary electrode 54 and the substrate 56 slid into the second process chamber 53 have substantially the same dissociation energies as shown in Table 3, when the high-frequency power is applied to the cylindrical rotary electrode 54, a composition ratio between the Si and N elements is invariable across a plasma space created in the gap along the upstream side to the downstream side of the rotation direction 55 of the cylindrical rotary electrode 54.

Therefore, when sliding the substrate 56 through the second process chamber 53, a homogeneous thin film is deposited on the substrate 56 such that a ratio between different types of elements of the thin film is invariable along the thickness direction thereof.

Figure 13:
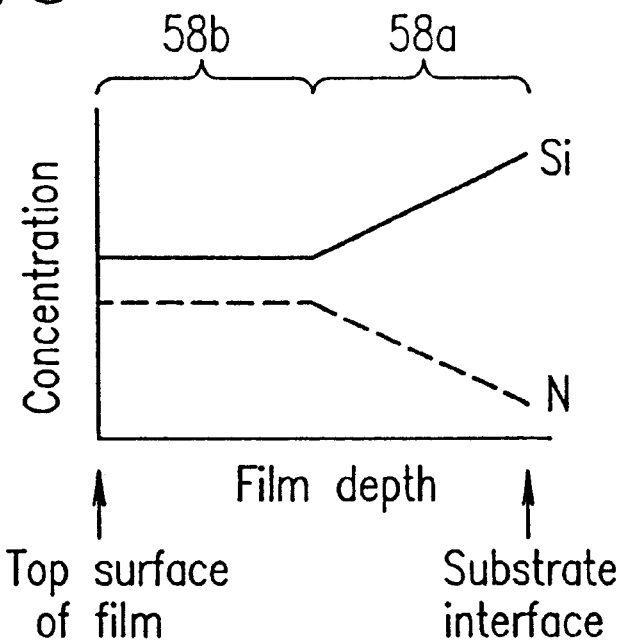
FIG. 13 shows concentration gradients along a thickness direction of thin films deposited by the method for depositing a functionally gradient thin film according to Example 4 of the present invention.

FIG. 13 shows concentration gradients along a thickness direction of the thin films deposited by the method for depositing a functionally gradient thin film according to Example 4. In FIG. 13, an area denoted by reference numeral 58a indicates a concentration gradient of a thin film deposited by sliding the substrate 56 through the first process chamber 50 and an area denoted by reference numeral 58b indicates a concentration gradient of a thin film deposited by sliding the substrate 56 through the second process chamber 53. The method for depositing a functionally gradient thin film according to Example 4 provides a functionally gradient thin film having a concentration gradient such that the lower portion of the thin film includes the N elements having a composition ratio to the Si elements which is sequentially increased along a direction from the bottom to the top of the thin film and a composition ratio between the Si and N elements of the thin film is invariable above the lower portion.

EXAMPLE 5

Figure 14:
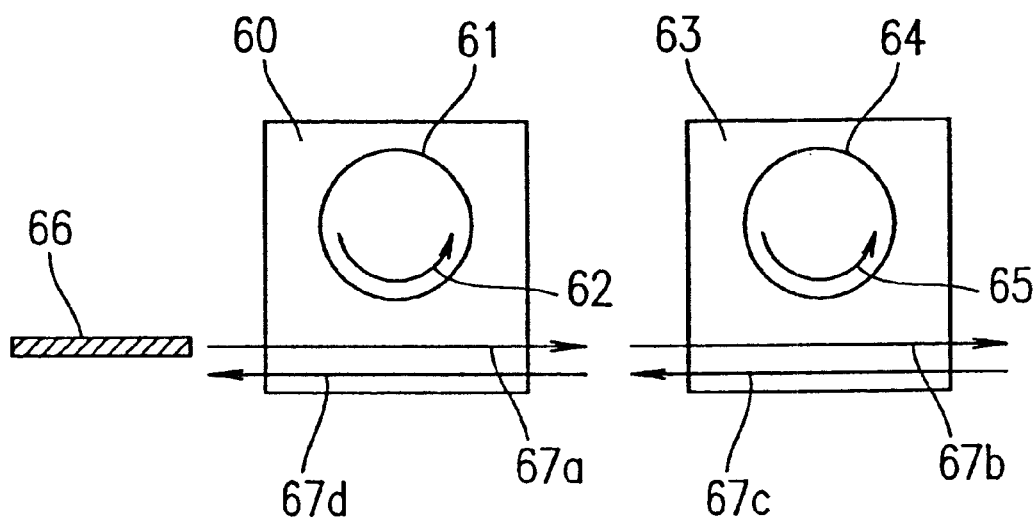
FIG. 14 is a schematic view for explaining a method for depositing a functionally gradient thin film according to Example 5 of the present invention.

FIG. 14 is a schematic view for explaining a method for depositing a functionally gradient thin film according to Example 5 of the present invention.

In the method for depositing a functionally gradient thin film according to Example 5, first and second process chambers 60 and 63 connected to each other are used. A substrate 66 on which a thin film is deposited is successively slid through the first and second process chambers 60 and 63 connected to each other along prescribed directions 67a and 67b and thereafter the substrate 66 is successively slid through the second process chamber 63 and the first process chamber 60 along reverse directions 67c and 67d opposite to the prescribed directions 67a and 67b.

The first process chamber 60 is located on the upstream side of the prescribed directions 67a and 67b along which the substrate 66 is moved and is filled with an SiH$_4$ gas, which is an Si element source, N$_2$ gas, which is an N element source, H$_2$ gas, and He gas, which is a carrier gas, at their respective desired concentrations. The second process chamber 63 is located on the downstream side of the prescribed directions 67a and 67b and is filled with SiH$_4$ gas, which is an Si element source, NH$_3$ gas, which is an N element source, H$_2$ gas, and He gas, which is a carrier gas, at their respective desired concentrations. Each of the first and second process chambers 60 and 63 is maintained in its respective atmosphere as described above. A cylindrical rotary electrode 61 in the first process chamber 60 is rotated along a direction indicated by arrow 62 (rotation direction 62) shown in FIG. 14 which is identical to the prescribed direction 67a and a cylindrical rotary electrode 64 in the second process chamber 63 is rotated along a direction indicated by arrow 65 (rotation direction 65) shown in FIG. 14 which is identical to the prescribed direction 67b. A high-frequency power is applied to each of the cylindrical rotary electrodes 61 and 64 in the respective first and second process chambers 60 and 63 so as to create plasma.

Since the SiH$_4$ and N$_2$ gases introduced into a gap between the cylindrical rotary electrode 61 and the substrate 66 slid into the first process chamber 60 along the prescribed direction 67a have different dissociation energies as shown in Table 3, when the high-frequency power is applied to the cylindrical rotary electrode 61, a plasma space created in the gap includes a large number of Si elements derived from the SiH$_4$ gas having a small dissociation energy on the upstream side of the rotation direction 62 of the cylindrical rotary electrode 61 and a composition ratio of the N elements derived from the N$_2$ gas having a large dissociation energy is sequentially increased along a direction from the upstream side to the downstream side of the rotation direction 62.

Therefore, when sliding the substrate 66 through the first process chamber 60 along the prescribed direction 67a identical to the rotation direction 62 of the cylindrical rotary electrode 61, a thin film is deposited on the substrate 66 so as to have a concentration gradient such that the lower portion of the thin film includes a large number of Si elements derived from the SiH$_4$ gas having a small dissociation energy and a ratio of the N elements to the Si elements is increased in the elemental composition of the thin film along a direction toward the top surface of the thin film.

After the film deposition in the first process chamber 60 is completed, the substrate 66 is slid into the second process chamber 63 along the prescribed direction 67b.

Since the SiH$_4$ and NH$_3$ gases introduced into a gap between the cylindrical rotary electrode 64 and the substrate 66 slid into the second process chamber 63 along the prescribed direction 67b have substantially the same dissociation energies as shown in Table 3, when the high-frequency power is applied to the cylindrical rotary electrode 64, a composition ratio between the Si and N elements is invariable across a plasma space created in the gap along the upstream side to the downstream side of the rotation direction 65 of the cylindrical rotary electrode 64.

Therefore, when sliding the substrate 66 through the second process chamber 63 along the prescribed direction 67b, a homogeneous thin film is deposited on the substrate 66 such that a ratio between different types of elements of the thin film is invariable along the thickness direction thereof.

After the film deposition in the second process chamber 63 along the prescribed direction 67b is completed, the substrate sliding direction is reversed so as to slide the substrate 66 into the second process chamber 63 along the reverse direction 67c opposite to the prescribed direction 67b.

When sliding the substrate 66 in the reverse direction 67c, plasma existing in the plasma space created in the gap between the cylindrical rotary electrode 64 and the substrate 66 causes a thin film to be deposited on the substrate 66 in the second process chamber 63. As described above, since the $SiH_4$ and $NH_3$ gases introduced into the gap between the cylindrical rotary electrode 64 and the substrate 66 in the second process chamber 63 have substantially the same dissociation energies, a composition ratio between the Si and N elements is invariable across the plasma space created in the gap along the upstream side to the downstream side of the rotation direction 65 of the cylindrical rotary electrode 64. Therefore, in the case of sliding the substrate 66 along the reverse direction 67c opposite to the prescribed direction 67b, a homogeneous thin film is also deposited on the substrate 66 such that a ratio between different types of elements of the thin film is invariable along the thickness direction thereof.

After the film deposition in the second process chamber 63 along the reverse direction 67c is completed, the substrate 66 is slid into the first process chamber 60 along the reverse direction 67d opposite to the prescribed direction 67a.

When sliding the substrate 66 in the reverse direction 67d, plasma existing in the plasma space created in the gap between the cylindrical rotary electrode 61 and the substrate 66 causes a thin film to be deposited on the substrate 66 in the first process chamber 60. As described above, since the $SiH_4$ and $N_2$ gasses introduced into the gap between the cylindrical rotary electrode 61 and the substrate 66 in the first process chamber 60 have different dissociation energies, the plasma space created in the gap includes a large number of Si elements derived from the $SiH_4$ gas having a small dissociation energy on the upstream side of the rotation direction 62 of the cylindrical rotary electrode 61 and a composition ratio of the N elements derived from the $N_2$ gas having a large dissociation energy is sequentially increased along a direction from the upstream side to the downstream side of the rotation direction 62.

Therefore, when sliding the substrate 66 through the first process chamber 60 along the reverse direction 67d, a thin film is deposited on the substrate 66 so as to have a concentration gradient such that the lower portion of the thin film includes a large number of N elements derived from the $N_2$ gas having a large dissociation energy and a ratio of the Si elements to the N elements is increased in the elemental composition of the thin film along a direction toward the top surface of the thin film.

Figure 15:
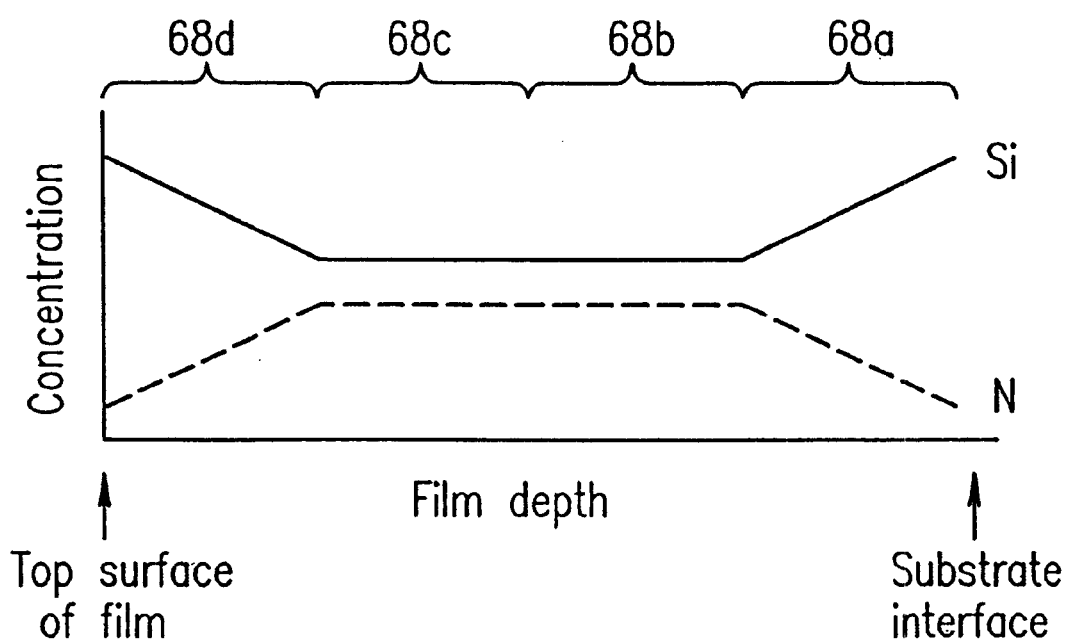
FIG. 15 shows concentration gradients along a thickness direction of thin films deposited by the method for depositing a functionally gradient thin film according to Example 5 of the present invention.

FIG. 15 shows concentration gradients along a thickness direction of the thin films deposited by the method for depositing a functionally gradient thin film according to Example 5. In FIG. 15, an area denoted by reference numeral 68a indicates a concentration gradient of a thin film deposited by sliding the substrate 66 through the first process chamber 60 along the prescribed direction 67a, an area denoted by reference numeral 68b indicates a concentration gradient of a thin film deposited by sliding the substrate 66 in the second process chamber 63 along the prescribed direction 67b, an area denoted by reference numeral 68c indicates a concentration gradient of a thin film deposited by sliding the substrate 66 through the second process chamber 63 along the reverse direction 67c, and an area denoted by reference numeral 68d indicates a concentration gradient of a thin film deposited by sliding the substrate 66 through the first process chamber 60 along the reverse direction 67d.

The method for depositing a functionally gradient thin film according to Example 5 provides a functionally gradient thin film having a concentration gradient such that the lower portion of the thin film includes the N elements having a composition ratio to the Si elements which is sequentially increased along a direction from the bottom surface to the top surface of the thin film, a composition ratio between the Si and N elements of the thin film is invariable above the lower portion, and further, the upper portion of the thin film includes the N elements having a composition ratio to the Si elements which is sequentially decreased along a direction from the top surface to the bottom surface of the thin film.

As described in Examples 2 through 5, in the method for depositing a functionally gradient thin film according to Embodiment 2, by suitably selecting two or more types of material gases having different or substantially equivalent dissociation energies and by selecting a direction along which a substrate is slid through one process chamber or a plurality of process chambers connected to each other, it is possible to provide a functionally gradient thin film having a desired elemental composition, such as a functionally gradient thin film having a pattern of concentration distribution in which concentrations of different types of elements complicatedly vary along a thickness direction of the thin film, and another functionally gradient thin film having a pattern of concentration distribution in which a ratio of concentrations between different types of elements is at least partly invariable along a thickness direction of the thin film.

According to the method for depositing a functionally gradient thin film of the present invention, two or more types of material gases having different dissociation energies are introduced into a plasma CVD device having a cylindrical rotary electrode, and therefore a plasma space is created in the plasma CVD device such that a thin film deposited on the upstream side of the plasma space includes a large number of elements sourced from a material gas having a small dissociation energy and a thin film deposited on the downstream side of the plasma space includes a large number of elements sourced from a material gas having a large dissociation energy. By sliding a substrate through the plasma space along a direction from the upstream side to the downstream side of the plasma space or a direction from the downstream side to the upstream side of the plasma space, it is possible to easily provide a functionally gradient thin film having a concentration gradient along a thickness direction of the thin film.

Further, according to the method for depositing a functionally gradient thin film of the present invention, by suitably selecting, in view of dissociation energies, material gases introduced into one or more plasma CVD devices each having a cylindrical rotary electrode and/or by selecting a direction along which a substrate is slid through the one or more process chambers connected to each other so as to sequentially deposit thin films, it is possible to easily provide a functionally gradient thin film having a complicated concentration gradient of an elemental composition and a thin film having a concentration gradient in which a ratio between different types of elements of the thin film is at least partly invariable.

Furthermore, by using the method for depositing a functionally gradient thin film of the present invention, for example, it is possible to provide a functionally gradient thin film having improved adhesiveness by controlling an elemental composition in an interface between a thin film and a substrate or an interface between different types of films so as to vary membrane stress, or it is possible to provide a functionally gradient thin film having non-conductivity or suitably-adjusted conductivity by controlling an elemental composition in an interface between a thin film and a substrate or an interface between different types of films so as to vary electric characteristics of the elemental composition.

Although two process chambers are included in Examples 3–5, more than two process chambers can be used in accordance with the present invention.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for depositing a functionally gradient thin film comprising the steps of:

introducing two or more types of material gases into a process chamber which includes a cylindrical rotary electrode provided so as to be opposed to a substrate on which a thin film is deposited, the cylindrical rotary electrode being rotated by applying a high-frequency power thereto; and sliding the substrate into the process chamber while maintaining the rotation of the cylindrical rotary electrode so as to create plasma between the cylindrical rotary electrode and the substrate for depositing the thin film.

2. A method for depositing a functionally gradient thin film according to claim 1, wherein the substrate is slid along a rotation direction of the cylindrical rotary electrode through a plasma space in which the plasma is created between the cylindrical rotary electrode and the substrate.

3. A method for depositing a functionally gradient thin film according to claim 1, wherein the substrate is slid along a direction opposite to the rotation direction of the cylindrical rotary electrode through the plasma space in which the plasma is created between the cylindrical rotary electrode and the substrate.

4. A method for depositing a functionally gradient thin film according to claim 1, wherein a thin film is deposited on the substrate under fixed conditions from a beginning to an end of the film deposition process.

5. A method for depositing a functionally gradient thin film according to claim 4, wherein the fixed conditions include concentrations related to concentrations of the material gases in the process chamber, the high-frequency power applied to the cylindrical rotary electrode so as to create the plasma, a size of a gap between the cylindrical rotary electrode and the substrate, a number of rotations per amount of time of the cylindrical rotary electrode, a temperature of the substrate, and a sliding speed of the substrate.

6. A method for depositing a functionally gradient thin film comprising the steps of:

providing a substrate on which a thin film is deposited in a process chamber which includes a cylindrical rotary electrode opposed to a substrate, the cylindrical rotary electrode being rotated by applying high-frequency power thereto;

introducing two or more types of material gases into the process chamber;

performing a first film deposition by rotating the cylindrical rotary electrode so as to form plasma between the cylindrical rotary electrode and the substrate for depositing the first thin film while sliding the substrate into the process chamber along a first sliding direction which is identical or opposite to a rotation direction of the cylindrical rotary electrode; and performing a second film deposition after the first film deposition by sliding the substrate along a second sliding direction opposite to the first sliding direction.

7. A method for depositing a functionally gradient thin film comprising the steps of:

providing a plurality of process chambers connected to each other, each of the plurality of process chambers including a cylindrical rotary electrode being rotated by applying high-frequency power thereto;

introducing two or more types of material gases having different dissociation energies into each of the plurality of process chambers; and depositing thin films by rotating the cylindrical rotary electrodes included in the plurality of process chambers along different directions while sliding a substrate on which the thin films are deposited through the plurality of process chambers along a prescribed direction so as to create plasma between the cylindrical rotary electrode and the substrate in each of the plurality of process chamber for depositing the films.

8. A method for depositing a functionally gradient thin film comprising the steps of:

providing a plurality of process chambers connected to each other, each of the plurality of process chambers including a cylindrical rotary electrode being rotated by applying high-frequency power thereto;

introducing two or more types of material gases having substantially equivalent dissociation energies into at least one of the plurality of process chambers and introducing two or more types of material gases having different dissociation energies into at least one of the other process chambers; and depositing thin films by rotating the cylindrical rotary electrodes included in the plurality of process chambers along their respective prescribed directions while sliding a substrate on which the thin films are deposited through the plurality of process chambers along a prescribed direction so as to create plasma between the cylindrical rotary electrode and the substrate in each of the plurality of process chamber for depositing the films.

9. A method for depositing a functionally gradient thin film comprising the steps of:

providing a plurality of process chambers connected to each other, each of the plurality of process chambers including a cylindrical rotary electrode being rotated by applying high-frequency power thereto;

introducing two or more types of material gases having substantially equivalent dissociation energies into at least one of the plurality of process chambers and introducing two or more types of material gases having different dissociation energies into at least one of the other process chambers;

performing a first film deposition by rotating the cylindrical rotary electrodes included in the plurality of process chambers along their respective rotation directions while sliding a substrate through the plurality of process chambers along a first sliding direction which is a prescribed direction; and performing a second film deposition after the first film deposition by sliding the substrate along a second sliding direction opposite to the first sliding direction.

* * * * *